(12) United States Patent
Satou

(10) Patent No.: US 7,666,736 B2
(45) Date of Patent: Feb. 23, 2010

(54) METHOD FOR FABRICATING SEMICONDUCTOR DEVICE COMPRISING P-TYPE MISFET, INCLUDING STEP OF IMPLANTING FLUORINE

(75) Inventor: Yoshihiro Satou, Niigata (JP)

(73) Assignee: Panasonic Corporation, Osaka (JP)

( * ) Notice: Subject to any disclaimer, the term of this patent is extended or adjusted under 35 U.S.C. 154(b) by 156 days.

(21) Appl. No.: 11/265,102

(22) Filed: Nov. 3, 2005

(65) Prior Publication Data

US 2006/0099748 A1   May 11, 2006

(30) Foreign Application Priority Data

Nov. 8, 2004   (JP) .............................. 2004-323381

(51) Int. Cl.
*H01L 21/8238* (2006.01)
(52) U.S. Cl. .................. 438/231; 438/230; 438/232
(58) Field of Classification Search .................. 438/231, 438/230
See application file for complete search history.

(56) References Cited

U.S. PATENT DOCUMENTS

| | | | | |
|---|---|---|---|---|
| 5,849,643 | A * | 12/1998 | Gilmer et al. ................ | 438/773 |
| 2005/0064645 | A1 * | 3/2005 | King ........................... | 438/217 |
| 2007/0059874 | A1 * | 3/2007 | Moumen et al. ............ | 438/199 |

FOREIGN PATENT DOCUMENTS

| EP | 0908947 A2 * | 4/1999 |
|---|---|---|
| JP | 2-39534 | 2/1990 |
| JP | 07-122746 A | 5/1995 |
| JP | 07122746 * | 12/1995 |
| JP | 8-195489 | 7/1996 |
| JP | 8-316465 | 11/1996 |
| JP | 8-330441 | 12/1996 |
| JP | 11-163346 A | 6/1999 |
| JP | 2004-281690 | 10/2004 |

OTHER PUBLICATIONS

Ambadi et al. ("Ambadi" Ambadi, Satheesh Tungsten and Tungsten Silicide (WSix) as Gate Materials for Trench MOSFETs Power Sem. Dev. And ICs 2000 Proc., The 12th Int. Symp. May 2000 pp. 181-184).*
Essaian et al. (Essaian, Stepan "Fluorine Ion Implantation into Silicon Dioxide to Form Stable Low-k Intermetal Dielectric Films" 2000 IEEE pp. 330-333).*
Hongo et al. (Hongo, C. "Accurate SIMS depth profiling for ultra-shallow implants using backside SIMS" App. Sur. Sci. 203-204 (2003) pp. 264-267).*
Wolf et al. (Wolf, Stanley "Silicon Processing for the VLSI Era" Lattice Press 2000 pp. 416-417).*
Japanese Office Action, with English translation, issued in Japanese Patent Application No. JP 2005-255452, mailed Sep. 18, 2007.
Chinese Office Action, with English translation thereof, issued in Patent Application No. 200510120089.6 dated on Aug. 15, 2008.

* cited by examiner

*Primary Examiner*—N Drew Richards
*Assistant Examiner*—Grant S Withers
(74) *Attorney, Agent, or Firm*—McDermott Will & Emery LLP

(57) ABSTRACT

After the implantation of fluorine ions into a semiconductor substrate, a gate insulating film, a gate electrode and a protective film are formed on the semiconductor substrate. Thereafter, fluorine ions are again implanted into the semiconductor substrate. Furthermore, p-type source/drain extension regions and source/drain regions are formed in the semiconductor substrate.

12 Claims, 6 Drawing Sheets

METHOD FOR FABRICATING SEMICONDUCTOR DEVICE COMPRISING P-TYPE MISFET, INCLUDING STEP OF IMPLANTING FLUORINE

CROSS-REFERENCE TO RELATED APPLICATIONS

The disclosure of Japanese Patent Application No. 2005-255452 filed on Sep. 2, 2005 including specification, drawings and claims is incorporated herein by reference in its entirety.

BACKGROUND OF THE INVENTION (1) Field of the Invention

The present invention relates to a method for fabricating a semiconductor device, and more particularly relates to a method for fabricating a high-reliability semiconductor device, which can restrain variations in the threshold voltage of a p-channel type metal insulator semiconductor (MIS) transistor (p-type metal insulator semiconductor field effect transistor (MISFET)) and the lowering of the saturation drain current thereof when it is used over the long term.

(2) Description of Related Art

In recent years, refinement and increase in density of semiconductor integrated circuits have been advancing. Under the deep-submicron design rule, so-called dual gate structures are currently dominating in which $n^+$ gate electrodes are used for n-type MISFETs of complementary metal insulator semiconductor (CMIS) transistors and $p^+$ gate electrodes are used for p-type MISFETs thereof. However, in a CMIS large scaled integration (CMISLSI) having this dual gate structure, boron that has been introduced into a polycrystalline polysilicon film to form a $p^+$ gate electrode for a p-type MISFET penetrates a gate insulating film in a later heat treatment step and diffuses also into a channel region of a p-type MISFET. This phenomenon called "boron penetration" easily occurs. It has been known that the occurrence of the phenomenon called boron penetration causes variations in transistor characteristics and a loss of the reliability of the gate insulating film.

A technique in which fluorine is implanted into a gate electrode to improve the reliability of a gate insulating film and prevent the transistor characteristics of a p-type MISFET from varying has been known as a technique for coping with the above problem (see, for example, Japanese Unexamined Patent Publication No. 11-163345).

A known fabrication method for a semiconductor device having a dual-gate structure will be described hereinafter with reference to the drawings.

FIGS. 7A through 7E are cross-sectional views showing process steps in the known fabrication method for a semiconductor device. The left side of each of FIGS. 7A through 7E shows a region Rn in which an n-type MISFET is to be formed (hereinafter, referred to as "n-type MISFET formation region Rn"), and the right side of each of FIGS. 7A through 7E shows a region Rp in which a p-type MISFET is to be formed (hereinafter, referred to as "p-type MISFET formation region Rp").

First, in the process step shown in FIG. 7A of the known fabrication method for a semiconductor device, an n well 101A and a p well 101B are formed in parts of a silicon substrate 101 located in the p-type MISFET formation region Rp and the n-type MISFET formation region Rn, respectively. Thereafter, an isolation area 102 is formed in the silicon substrate 101 to surround active areas of the silicon substrate 101.

Next, in the process step shown in FIG. 7B, an oxide film 103 is formed on the silicon substrate 101, and then a non-doped polycrystalline silicon film 104 is formed on the oxide film 103.

Next, in the process step shown in FIG. 7C, the polycrystalline silicon film 104 and the oxide film 103 are patterned, thereby forming, on the active area of a part of the silicon substrate 101 located in the p-type MISFET formation region Rp, a gate electrode 104A and a gate insulating film 103A both for a p-type MISFET and forming, on the active area of a part of the silicon substrate 101 located in the n-type MISFET formation region Rn, a gate electrode 104B and a gate insulating film 103B both for an n-type MISFET.

Next, in the process step shown in FIG. 7D, fluorine ions 108 are implanted into the gate electrodes 104A and 104B and an exposed part of the silicon substrate 101 from the direction approximately perpendicular to the top surface of the silicon substrate 101 at an implantation energy of 10 keV and an implant dose of $2 \times 10^{13}$ through $2 \times 10^{15}$ ions/cm$^2$.

Next, in the process step shown in FIG. 7E, sidewalls 105 made of a silicon oxide film are formed on the side surfaces of the gate electrodes 104A and 104B, respectively. Thereafter, n-type impurity diffusion layers 106 that will be source/drain regions of an n-type MISFET are formed in the n-type MISFET formation region Rn by implanting arsenic ions serving as an n-type impurity into a part of the silicon substrate 101 located in the n-type MISFET formation region Rn, and p-type impurity diffusion layers 107 that will be source/drain regions of a p-type MISFET are formed in the p-type MISFET formation region Rn by implanting boron ions serving as a p-type impurity into a part of the silicon substrate 101 located in the p-type MISFET formation region Rp. Thereafter, the entire substrate region is subjected to rapid heat treatment for activating the implanted impurity ions, thereby completing a p-type MISFET and an n-type MISFET. This rapid heat treatment allows fluorine ions to diffuse from the gate electrodes 104A and 104B into the gate insulating films 103A and 103B.

According to this fabrication method, since in a p-type MISFET fluorine is introduced into a gate insulating film 103A, this reduces the physical stress applied to a gate insulating film due to the difference in coefficient of thermal expansion between a gate electrode 104A and the gate insulating film 103A and improves the reliability of transistors. Furthermore, fluorine is introduced into a $p^+$ gate electrode 104A at a dose of $2 \times 10^{13}$ through $2 \times 10^{15}$ ions/cm$^2$, and the action of this fluorine can restrain boron introduced into the $p^+$ gate electrode 104A from entering into the gate insulating film 103A and the semiconductor substrate 101 and prevent variations in transistor characteristics and deterioration of the reliability of transistors.

However, with the passage of time, the known fabrication method for a semiconductor device as shown in FIGS. 7A through 7E varies the threshold voltage and decreases the drain current.

SUMMARY OF THE INVENTION

In view of the above, it is an object of the present invention to provide a fabrication method for a semiconductor device which can restrain the threshold voltage and the drain current from varying over time by optimizing the dose of fluorine to be implanted into a gate electrode and the dose of fluorine to be implanted into source/drain regions.

According to a first aspect of the present invention, a method for fabricating a semiconductor device comprises the steps of: (a) implanting fluorine ions into a semiconductor substrate; (b) after the step (a), forming a gate insulating film on the semiconductor substrate; (c) forming a gate electrode on the gate insulating film; (d) forming p-type source/drain extension regions in parts of the semiconductor substrate located below the lateral end parts of the gate electrode; (e) after the step (c), implanting fluorine ions into the parts of the semiconductor substrate located below the lateral end parts of the gate electrode; (f) after the steps (d) and (e), forming a sidewall on the side surfaces of the gate electrode; and (g) forming p-type source/drain regions in parts of the semiconductor substrate located below the outer lateral end parts of the sidewall.

According to the method of the first aspect of the present invention, fluorine ions are implanted only into the semiconductor substrate and then implanted into both the semiconductor substrate and the gate electrode. Therefore, the concentration (dose) of fluorine ions in the semiconductor substrate can be made higher than that in the gate electrode. In this way, dangling bonds of silicon can be terminated by fluorine in the channel region of a p-type MISFET. This can restrain the time variation in the threshold voltage and degradation in the saturation drain current. Furthermore, an excessive amount of fluorine can be prevented from being implanted into the gate electrode, resulting in the prevented boron penetration. Moreover, since many traps can be restrained from being formed in the gate insulating film, this can prevent the reliability of the gate insulating film from being reduced.

In the method of the first aspect of the present invention, the total dose of fluorine to be implanted into parts of the semiconductor substrate located under the sidewall is larger than that to be implanted into the gate electrode.

In the method of the first aspect of the present invention, in the step (e), the fluorine ion implantation may be performed with the top surface of the gate electrode covered with a protective film. This permits accurate adjustment of the amount of fluorine to be implanted into the gate electrode.

According to a second aspect of the present invention, a method for fabricating a semiconductor device comprises the steps of: (a) forming a gate insulating film on a semiconductor substrate; (b) forming a film for the formation of a gate electrode on the gate insulating film; (c) implanting fluorine ions into the film for the formation of a gate electrode; (d) after the step (d), forming a gate electrode on the gate insulating film by patterning the film for the formation of the gate electrode; (e) forming p-type source/drain extension regions in parts of the semiconductor substrate located below the lateral end parts of the gate electrode; (f) after the step (d), implanting fluorine ions into the parts of the semiconductor substrate located below the lateral end parts of the gate electrode with the top surface of the gate electrode covered with a protective film; (g) after the steps (e) and (f), forming a sidewall on the side surfaces of the gate electrode; and (h) forming p-type source/drain regions in parts of the semiconductor substrate located below the outer lateral end parts of the sidewall.

According to the method of the second aspect of the present invention, the amount of fluorine in the gate electrode can be adjusted by adjusting the dose of fluorine in the implantation of fluorine into the film for the formation of a gate electrode. Therefore, an excessive amount of fluorine can be prevented from being implanted into the gate electrode, resulting in the prevented boron penetration. Moreover, since many traps can be restrained from being caused in the gate insulating film, this can prevent the reliability of the gate insulating film from being reduced. Meanwhile, fluorine ions are implanted into the semiconductor substrate with the top surface of the gate electrode covered with the protective film. Therefore, the respective amounts of fluorine to be implanted into the semiconductor substrate and the gate electrode can be adjusted, thereby terminating dangling bonds of silicon in the channel region of a p-type MISFET. This can restrain the time variation in the threshold voltage and degradation in the saturation drain current.

In the method of the second aspect of the present invention, the total dose of fluorine to be implanted into parts of the semiconductor substrate located under the sidewall is larger than that to be implanted into the gate electrode.

According to a third aspect of the present invention, a method for fabricating a semiconductor device comprises the steps of: (a) forming a gate insulating film on a semiconductor substrate; (b) forming a gate electrode on the gate insulating film; (c) forming p-type source/drain extension regions in parts of the semiconductor substrate located below the lateral end parts of the gate electrode; (d) implanting fluorine ions into the parts of the semiconductor substrate located below the lateral end parts of the gate electrode with the top surface of the gate electrode covered with a protective film; (e) after the steps (c) and (d), forming a sidewall on the side surfaces of the gate electrode; and (f) forming p-type source/drain regions in parts of the semiconductor substrate located below the outer lateral end parts of the sidewall.

According to the method of the third aspect of the present invention, the fluorine ion implantation is performed with the top surface of the gate electrode covered with the protective film. This permits the adjustment of the amount of fluorine to be implanted into the gate electrode. Therefore, an excessive amount of fluorine can be prevented from being implanted into the gate electrode, resulting in the prevented boron penetration. Moreover, since many traps can be restrained from being formed in the gate insulating film, this can prevent the reliability of the gate insulating film from being reduced. Meanwhile, a sufficient amount of fluorine can be implanted into the semiconductor substrate, thereby terminating dangling bonds of silicon in the channel region of a p-type MISFET. This can restrain the time variation in the threshold voltage and degradation in the saturation drain current.

In the method of the third aspect of the present invention, in the step (d), some of the fluorine ions implanted into the protective film reach the gate electrode, and the total dose of fluorine to be implanted into parts of the semiconductor substrate located under the sidewall is larger than that to be implanted into the gate electrode.

DETAILED DESCRIPTION OF THE INVENTION

Inventors' Consideration

Findings from the present inventors' consideration of the problems described in "Description of Related Art" will be described hereinafter.

As described in "Description of Related Art", the threshold voltage of a transistor varies over time and the saturation drain current thereof decreases. It is considered that the cause for this is that the ends of silicon atoms located in the top surface of a channel region of a silicon substrate 101 remain as dangling bonds. More particularly, carriers are trapped in these dangling bonds, leading to the reduced function of the channel region. As a result, the threshold voltage varies and the saturation drain current decreases. Even when silicon atoms are bonded to hydrogen atoms to prevent the above problems, the hydrogen atoms are eliminated from the Si—H bonds with the passage of time due to relatively weak Si—H bonds. This facilitates producing dangling bonds.

It is considered that, in order to suppress the formation of dangling bonds, Si—F bonds stronger than Si—H bonds need be formed. However, it was found that when a gate electrode is doped with a large amount of fluorine enough to suppress the formation of dangling bonds, this causes segregation of a large amount of fluorine at the interface between the gate electrode and a gate insulating film, resulting in the promoted penetration of boron contained in the gate electrode through the gate insulating film. Furthermore, it was found that many traps are formed in the gate insulating film, leading to the reduced reliability of the gate insulating film.

To cope with the above problems, in the present invention, a gate electrode and a silicon substrate are doped with necessary amounts of fluorine, respectively.

Embodiment 1

A fabrication method for a semiconductor device according to a first embodiment of the present invention will be described hereinafter with reference to the drawings.

FIGS. 1A through 1F are cross-sectional views showing process steps in the fabrication method for a semiconductor device according to the first embodiment of the present invention. The left side of each of FIGS. 1A through 1F shows an n-type MISFET (nMIS transistor) formation region Rn, and the right side of each of FIGS. 1A through 1F shows a p-type MISFET (pMIS transistor) formation region Rp.

Figure 1A:
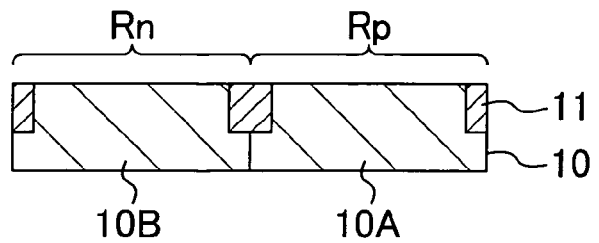
FIGS. 1A through 1F are cross-sectional views showing process steps in a fabricating method for a semiconductor device according to a first embodiment of the present invention.

First, in the process step shown in FIG. 1A of the fabrication method for a semiconductor device of this embodiment, an isolation area 11 is formed in a semiconductor substrate 10 of silicon by shallow trench isolation (STI) to surround active areas of the semiconductor substrate 10. Then, an n well 10A and a p well 10B are formed in parts of the semiconductor substrate 10 located in the p-type MISFET formation region Rp and the n-type MISFET formation region Rn, respectively. Thereafter, ions are implanted into the p-type MISFET formation region Rp and the n-type MISFET formation region Rn to adjust the threshold voltage, thereby forming diffusion layers for the adjustment of the threshold voltage (not shown) in both the regions, respectively.

Figure 1B:
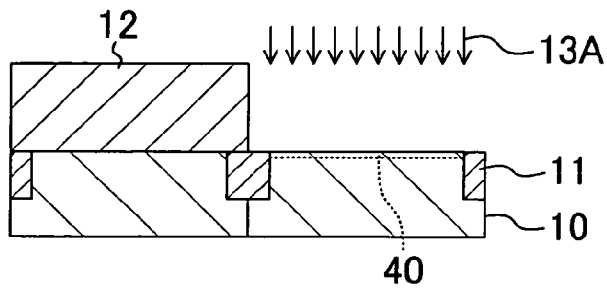

Next, in the process step shown in FIG. 1B, a resist 12 is formed on the semiconductor substrate 10 to cover the n-type MISFET formation region Rn and expose the p-type MISFET formation region Rp. Then, fluorine ions 13A are implanted, using the resist 12 as a mask, into the active area of a part of the semiconductor substrate 10 located in the p-type MISFET formation region Rp at an implantation energy of 15 keV and an implant dose of $2 \times 10^{15}$ ions/cm$^2$, thereby forming a fluorine-doped layer 40. When fluorine ions are implanted into this active area under the above conditions, the fluorine ions 13A reaches the vicinity of the top surface of the semiconductor substrate 10.

Figure 1C:
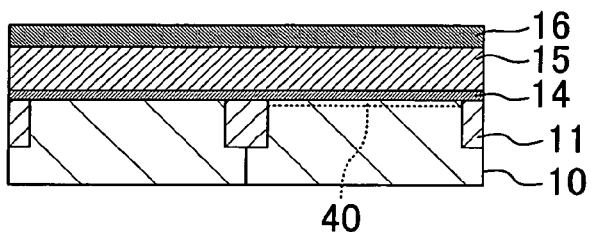

Next, in the process step shown in FIG. 1C, the resist 12 is removed, and then a 2-nm-thick silicon oxide film 14 is formed on the semiconductor substrate 10. Thereafter, a 180-nm-thick polycrystalline silicon film 15 is formed on the silicon oxide film 14. Subsequently, a 100-nm-thick silicon oxide film 16 is formed on the polycrystalline silicon film 15.

Figure 1D:
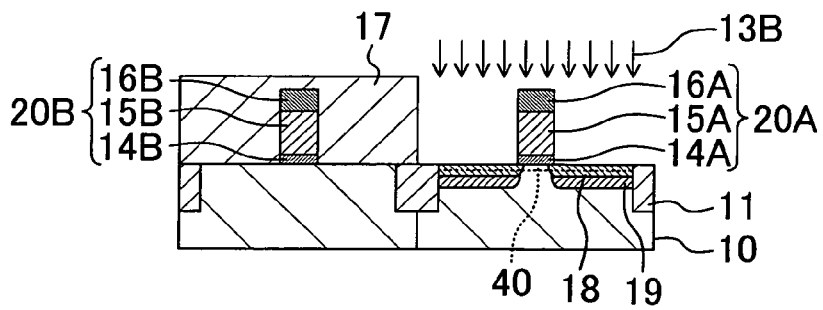

Next, in the process step shown in FIG. 1D, a mask for the formation of gate electrodes (not shown) is formed on the silicon oxide film 16, and the silicon oxide film 16 is selectively etched using the mask. In this way, protective insulating films 16A and 16B of silicon oxide are formed. Thereafter, the mask for the formation of gate electrodes is removed, and then the polycrystalline silicon film 15 and the silicon oxide film 14 are selectively etched using the protective insulating films 16A and 16B as hard masks, thereby forming gate insulating films 14A and 14B and gate electrodes 15A and 15B. In this way, a gate electrode precursor 20A composed of the gate insulating film 14A, the gate electrode 15A and the protective insulating film 16A is partly formed on the active area of a part of the semiconductor substrate 10 located in the p-type MISFET formation region Rp. A gate electrode precursor 20B composed of the gate insulating film 14B, the gate electrode 15B and the protective insulating film 16B is partly formed on the active area of a part of the semiconductor substrate 10 located in the n-type MISFET formation region Rn. The selective etching of the polycrystalline silicon film 15 and the silicon oxide film 14 reduces the thickness of the protective insulating films 16A and 16B used as hard masks to about 40 nm.

Thereafter, a resist 17 is formed on the semiconductor substrate 10 to cover the n-type MISFET formation region Rn and expose the p-type MISFET formation region Rp. Then, boron ions serving as a p-type impurity are implanted, using the resist 17 and the gate electrode precursor 20A as masks, into the active area of a part of the semiconductor substrate 10 located in the p-type MISFET formation region Rp at an implantation energy of 0.5 keV and an implant dose of $4 \times 10^{14}$ ions/cm$^2$, thereby forming p-type source/drain extension regions 18.

Next, arsenic ions serving as an n-type impurity are implanted, using the resist 17 and the gate electrode precursor 20A as masks, into the active area of a part of the semiconductor substrate 10 located in the p-type MISFET formation region Rp at an implantation energy of 70 keV and an implant dose of $3.2 \times 10^{13}$ ions/cm$^2$, thereby forming n-type pocket regions 19. This arsenic ion implantation is performed by rotational ion implantation at an implantation angle of 25°. Furthermore, fluorine ions 13B are implanted, using the resist 17 and the gate electrode precursor 20A as masks, into the active area of a part of the semiconductor substrate 10 located in the p-type MISFET formation region Rp at an implantation energy of 15 keV and an implant dose of $1 \times 10^{15}$ ions/cm$^2$. This increases the concentration of fluorine in the fluorine-doped layer 40 formed in the top surface of the semiconductor substrate 10.

Since in this case the protective insulating film 16A is formed on the gate electrode 15A to have a larger thickness than the depth to which fluorine is implanted into the semiconductor substrate 10, fluorine ions are implanted only into the semiconductor substrate 10 without being implanted into the gate electrode 15A. When fluorine ions are implanted into the active area of a part of the semiconductor substrate 10 located in the p-type MISFET formation region Rp under these implantation conditions, the range of fluorine reaches the vicinity of the top surface of the semiconductor substrate 10. The amount of fluorine to be implanted into the gate electrode 15A can be adjusted by any adjustment, for example, reduction in the thickness of the protective insulating film 16A.

Figure 1E:
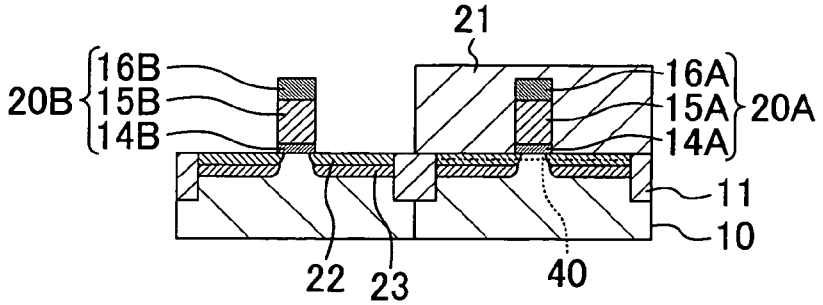

Next, in the process step shown in FIG. 1E, the resist 17 is removed, and then a resist 21 is formed on the semiconductor substrate 10 to cover the p-type MISFET formation region Rp and expose the n-type MISFET formation region Rn. Thereafter, arsenic ions serving as an n-type impurity are implanted, using the resist 21 and the gate electrode precursor 20B as masks, into the active area of a part of the semiconductor substrate 10 located in the n-type MISFET formation region Rn at an implantation energy of 4 keV and an implant dose of $6 \times 10^{14}$ ions/cm$^2$, thereby forming n-type source/drain extension regions 22. Next, boron ions serving as a p-type impurity are implanted, using the resist 21 and the gate electrode precursor 20B as masks, into the active area of a part of the semiconductor substrate 10 located in the n-type MISFET formation region Rn at an implantation energy of 12 keV and an implant dose of $3.6 \times 10^{13}$ ions/cm$^2$, thereby forming p-type pocket regions 23. This boron ion implantation is performed by rotational ion implantation at an implantation angle of 2.5°.

Figure 1F:
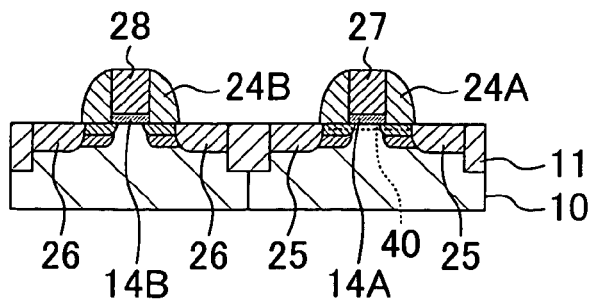

Next, in the process step shown in FIG. 1F, the resist 21 is removed, and then an insulating film (not shown) is formed to cover the semiconductor substrate 10 and the gate electrode precursors 20A and 20B and then subjected to anisotropic etching. In this way, sidewalls 24A and 24B are formed on the side surfaces of the gate electrodes 15A and 15B, respectively. Simultaneously, the protective insulating films 16A and 16B formed on the gate electrodes 15A and 15B are etched by overetching in the formation of the sidewalls 24A and 24B, thereby exposing the top surfaces of the gate electrodes 15A and 15B.

Subsequently, a mask (not shown) is formed to cover the top surface of a part of the semiconductor substrate 10 located in the n-type MISFET formation region Rn and expose the top surface of a part of the semiconductor substrate 10 located in the p-type MISFET formation region Rp. Then, boron ions serving as a p-type impurity are implanted, using the mask, into the active area of a part of the semiconductor substrate 10 located in the p-type MISFET formation region Rp at an implantation energy of 3 keV and an implant dose of $3.6 \times 10^{15}$ ions/cm$^2$, thereby selectively forming heavily-doped p-type source/drain regions 25. Simultaneously with the formation of the p-type source/drain regions 25, boron ions are implanted into the gate electrode 15A to form a p$^+$ gate electrode 27.

On the other hand, a mask (not shown) is formed on the semiconductor substrate 10 to cover the p-type MISFET formation region Rp and expose the n-type MISFET formation region Rn. Then, arsenic ions serving as an n-type impurity are implanted, using the mask, into the active area of a part of the semiconductor substrate 10 located in the n-type MISFET formation region Rn at an implantation energy of 50 keV and an implant dose of $4.0 \times 10^{15}$ ions/cm$^2$, thereby forming heavily-doped n-type source/drain regions 26. Simultaneously with the formation of the n-type source/drain regions 26, arsenic ions are implanted into the gate electrode 15B to form an n$^+$ gate electrode 28.

Thereafter, the semiconductor substrate 10 is subjected to spike rapid thermal annealing (RTA) under a nitrogen atmosphere at a temperature of 1075° C., thereby activating impurities implanted into the source/drain regions 25 and 26 and the gate electrodes 27 and 28.

Since in this embodiment the concentration (dose) of fluorine ions in a semiconductor substrate 10 is made higher than that in a gate electrode 15A, dangling bonds of silicon can be terminated by fluorine in the channel region of a p-type MISFET. This can restrain the time variation in the threshold voltage and degradation in the saturation drain current. Furthermore, an excessive amount of fluorine ions can be prevented from being implanted into the gate electrode 15A, resulting in the prevented boron penetration. Moreover, since many traps can be restrained from being formed in a gate insulating film 14A, this can prevent the reliability of the gate insulating film 14A from being reduced.

In the above description, when fluorine ions 13B are implanted into the active area of a part of a semiconductor substrate 10 located in a p-type MISFET formation region Rp in the process step shown in FIG. 1D, the top surface of a gate electrode 15A is covered with a protective insulating film 16A. This permits accurate adjustment of the amount of fluorine to be implanted into the gate electrode 15A. However, in the present invention, the top surface of the gate electrode 15A does not necessarily have to be covered with the protective insulating film 16A.

In this embodiment, after the implantation of fluorine ions into the active area of a part of the semiconductor substrate 10 located in the p-type MISFET formation region Rp in the process step shown in FIG. 1B, fluorine ions are again implanted into the active area of a part of the semiconductor substrate 10 located in the p-type MISFET formation region Rp in the process step shown in FIG. 1D. In this way, even when a fluorine-doped layer 40 is mostly removed in the patterning of a polycrystalline silicon film 15 in the process step shown in FIG. 1D, the concentration of fluorine in the fluorine-doped layer 40 can be increased after this removal.

Although in this embodiment fluorine ions are implanted only into a part of the semiconductor substrate 10 located in the p-type MISFET formation region Rp, fluorine ions may be implanted also into a part thereof located in an n-type MISFET formation region Rn.

Embodiment 2

A fabrication method for a semiconductor device according to a second embodiment of the present invention will be described hereinafter with reference to the drawings.

FIGS. 2A through 2F are cross-sectional views showing process steps in the fabrication method for a semiconductor device according to the second embodiment of the present invention. The left side of each of FIGS. 2A through 2F shows an n-type MISFET (nMIS transistor) formation region Rn, and the right side of each of FIGS. 2A through 2F shows a p-type MISFET (pMIS transistor) formation region Rp.

Figure 2A:
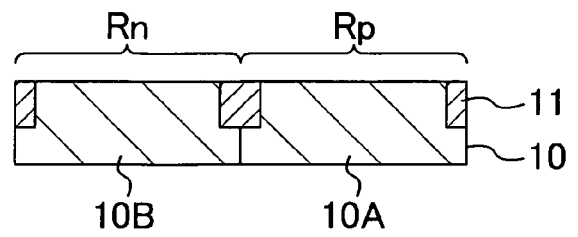
FIGS. 2A through 2F are cross-sectional views showing process steps in a fabricating method for a semiconductor device according to a second embodiment of the present invention.

First, in the process step shown in FIG. 2A of the fabrication method for a semiconductor device of this embodiment, an isolation area 11 is formed in a semiconductor substrate 10 of silicon by STI to surround active areas of the semiconductor substrate 10. Then, an n well 10A and a p well 10B are formed in parts of the silicon substrate 10 located in the p-type MISFET formation region Rp and the n-type MISFET formation region Rn, respectively. Thereafter, ions are implanted into the p-type MISFET formation region Rp and the n-type MISFET formation region Rn to adjust the threshold voltage, thereby forming diffusion layers for the adjustment of the threshold voltage (not shown) in both the regions, respectively.

Figure 2B:
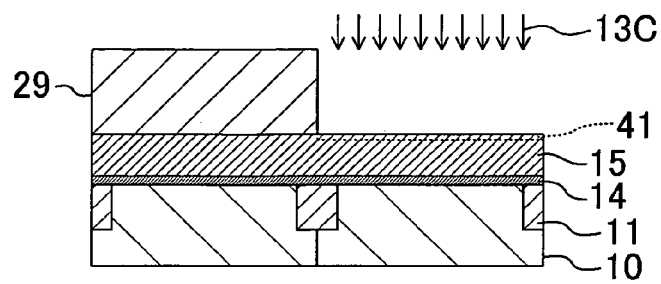

Next, in the process step shown in FIG. 2B, a 2-nm-thick silicon oxide film 14 is formed on the semiconductor substrate 10. Then, a 180-nm-thick polycrystalline silicon film 15 is formed on the silicon oxide film 14. Subsequently, a resist 29 is formed on the polycrystalline silicon film 15 to cover the n-type MISFET formation region Rn and expose the p-type MISFET formation region Rp. Thereafter, fluorine ions 13C are implanted, using the resist 29 as a mask, into a part of the polycrystalline silicon film 15 located in the p-type MISFET formation region Rp at an implantation energy of 15 keV and an implant dose of $1 \times 10^{15}$ ions/cm$^2$, thereby forming a fluorine-doped layer 41 in the top surface of the polycrystalline silicon film 15. When fluorine ions are implanted into the part of the polycrystalline silicon film 15 under the above conditions, fluorine ions 13C reaches the vicinity of the top surface of the polycrystalline silicon film 15.

Figure 2C:
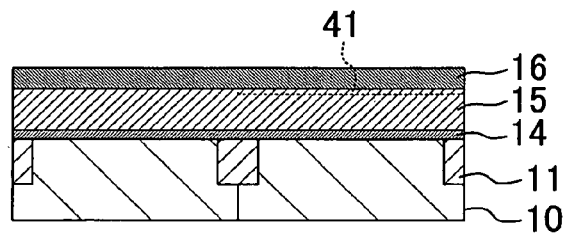

Next, in the process step shown in FIG. 2C, the resist 29 is removed, and then a 100-nm-thick silicon oxide film 16 is formed on the polycrystalline silicon film 15.

Figure 2D:
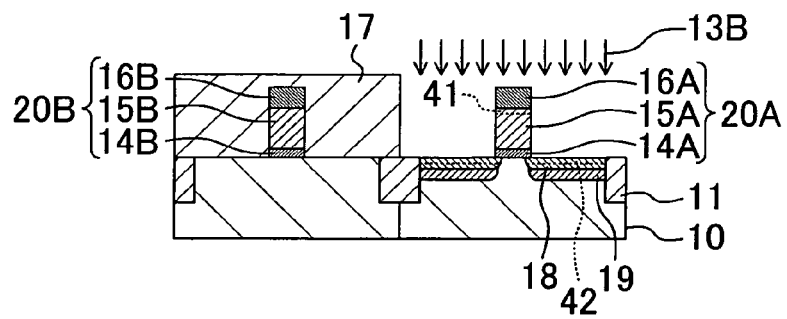

Next, in the process step shown in FIG. 2D, a mask for the formation of gate electrodes (not shown) is formed on the silicon oxide film 16, and the silicon oxide film 16 is selectively etched using the mask. In this way, protective insulating films 16A and 16B of silicon oxide are formed. Thereafter, the mask for the formation of gate electrodes is removed, and then the polycrystalline silicon film 15 and the silicon oxide film 14 are selectively etched using the protective insulating films 16A and 16B as hard masks, thereby forming gate insulating films 14A and 14B and gate electrodes 15A and 15B. In this way, a gate electrode precursor 20A composed of the gate insulating film 14A, the gate electrode 15A and the protective insulating film 16A for a p-type MISFET is partly formed on the active area of a part of the semiconductor substrate 10 located in the p-type MISFET formation region Rp. A gate electrode precursor 20B composed of the gate insulating film 14B, the gate electrode 15B and the protective insulating film 16B for an n-type MISFET is partly formed on the active area of a part of the semiconductor substrate 10 located in the n-type MISFET formation region Rn. The selective etching of the polycrystalline silicon film 15 and the silicon oxide film 14 reduces the thickness of the protective insulating films 16A and 16B used as hard masks to about 40 nm.

Thereafter, a resist 17 is formed on the semiconductor substrate 10 to cover the n-type MISFET formation region Rn and expose the p-type MISFET formation region Rp. Then, boron ions serving as a p-type impurity are implanted, using the resist 17 and the gate electrode precursor 20A as masks, into the active area of a part of the semiconductor substrate 10 located in the p-type MISFET formation region Rp at an implantation energy of 0.5 keV and an implant dose of $4 \times 10^{14}$ ions/cm$^2$, thereby forming p-type source/drain extension regions 18. Next, arsenic ions serving as an n-type impurity are implanted, using the resist 17 and the gate electrode precursor 20A as masks again, into the active area of a part of the semiconductor substrate 10 located in the p-type MISFET formation region Rp at an implantation energy of 70 keV and an implant dose of $3.2 \times 10^{13}$ ions/cm$^2$, thereby forming n-type pocket regions 19. This arsenic ion implantation is performed by rotational ion implantation at an implantation angle of 25°. Furthermore, fluorine ions 13B are implanted, using the resist 17 and the gate electrode precursor 20A as masks, into the active area of a part of the semiconductor substrate 10 located in the p-type MISFET formation region Rp at an implantation energy of 15 keV and an implant dose of $1 \times 10^{15}$ ions/cm$^2$. In this way, fluorine-doped layers 42 are formed in parts of the semiconductor substrate 10 in which a source and a drain are to be formed. Since in this case the protective insulating film 16A is formed on the gate electrode 15A to have a larger thickness than the depth to which fluorine is implanted into part of the semiconductor substrate 10, fluorine is implanted only into the semiconductor substrate 10 without being implanted into the gate electrode 15A. When the fluorine ions 13B are implanted into the active area of a part of the semiconductor substrate 10 located in the p-type MISFET formation region Rp under the above conditions, the fluorine ions 13B reaches the vicinity of the top surface of the semiconductor substrate 10.

Figure 2E:
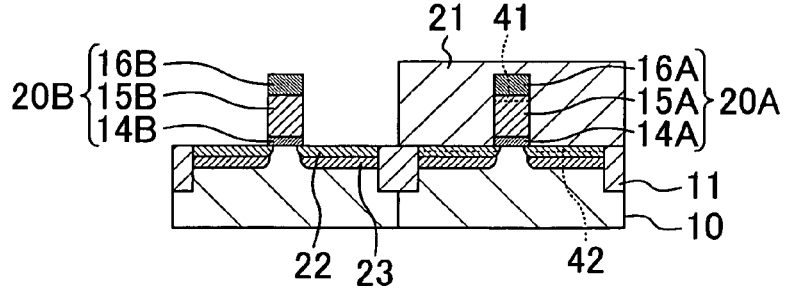

Next, in the process step shown in FIG. 2E, the resist 17 is removed, and then a resist 21 is formed on the semiconductor substrate 10 to cover the p-type MISFET formation region Rp and expose the n-type MISFET formation region Rn. Thereafter, arsenic ions serving as an n-type impurity are implanted, using the resist 21 and the gate electrode precursor 20B as masks, into the active area of a part of the semiconductor substrate 10 located in the n-type MISFET formation region Rn at an implantation energy of 4 keV and an implant dose of $6 \times 10^{14}$ ions/cm$^2$, thereby forming n-type source/drain extension regions 22. Next, boron ions serving as a p-type impurity are implanted, using the resist 21 and the gate electrode precursor 20B as masks, into the active area of a part of the semiconductor substrate 10 located in the n-type MISFET formation region Rn at an implantation energy of 12 keV and an implant dose of $3.6 \times 10^{13}$ ions/cm$^2$, thereby forming p-type pocket regions 23. This boron ion implantation is performed by rotational ion implantation at an implantation angle of 25°.

Figure 2F:
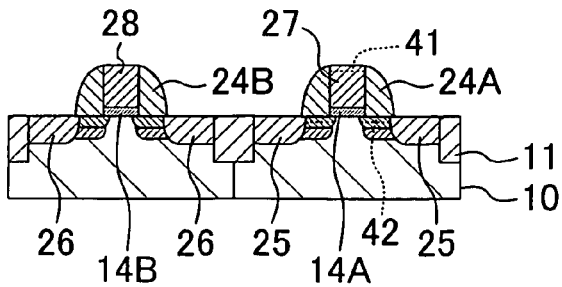

Next, in the process step shown in FIG. 2F, the resist 21 is removed, and then an insulating film (not shown) is formed to cover the semiconductor substrate 10 and the gate electrode precursors 20A and 20B and then subjected to anisotropic etching. In this way, sidewalls 24A and 24B are formed on the side surfaces of the gate electrodes 15A and 15B, respectively. Simultaneously, the protective insulating films 16A and 16B formed on the gate electrodes 15A and 15B are etched by overetching in the formation of the sidewalls 24A and 24B, thereby exposing the top surfaces of the gate electrodes 15A and 15B.

Subsequently, a mask (not shown) is formed on the semiconductor substrate 10 to cover the n-type MISFET formation region Rn and expose the p-type MISFET formation region Rp. Then, boron ions serving as a p-type impurity are implanted, using the mask, into the active area of a part of the semiconductor substrate 10 located in the p-type MISFET formation region Rp at an implantation energy of 3 keV and an implant dose of $3.6 \times 10^{15}$ ions/cm$^2$, thereby selectively forming heavily-doped p-type source/drain regions 25. Simultaneously with the formation of the p-type source/drain regions 25, boron ions are implanted into the gate electrode 15A to form a p$^+$ gate electrode 27.

On the other hand, a mask (not shown) is formed on the semiconductor substrate 10 to cover the p-type MISFET formation region Rp and expose the n-type MISFET formation region Rn. Then, arsenic ions serving as an n-type impurity are implanted, using the mask, into the active area of a part of the semiconductor substrate 10 located in the n-type MISFET formation region Rn at an implantation energy of 50 keV and an implant dose of $4.0 \times 10^{15}$ ions/cm$^2$, thereby forming heavily-doped n-type source/drain regions 26. Simultaneously with the formation of the n-type source/drain regions 26, arsenic ions are implanted into the gate electrode 15B to form an n+ gate electrode 28.

Thereafter, the semiconductor substrate 10 is subjected to spike RTA under a nitrogen atmosphere at a temperature of 1075° C., thereby activating impurities implanted into the source/drain regions 25 and 26 and the gate electrodes 27 and 28. This spike RTA allows fluorine in the gate electrode 15A to diffuse toward the interface between the gate insulating film 14A and the semiconductor substrate 10.

In this embodiment, fluorine ions are implanted into a polycrystalline silicon film 15 in the process step shown in FIG. 2B. Since a part of the polycrystalline silicon film 15 forms a gate electrode 15A, the amount of fluorine in the gate electrode 15A can be adjusted by adjusting the dose at which fluorine is implanted into the polycrystalline silicon film 15 in the process step shown in FIG. 2B. This can prevent an excessive amount of fluorine from being implanted into the gate electrode 15A, resulting in the prevented boron penetration. Furthermore, since many traps can be restrained from being formed in a gate insulating film 14A, this can prevent the reliability of the gate insulating film 14A from being reduced.

Meanwhile, in the process step shown in FIG. 2D, fluorine is implanted into a silicon substrate 10 with the top surface of a gate electrode 15A covered with a protective insulating film 16A. Therefore, the respective amounts of fluorine to be implanted into the semiconductor substrate 10 and the gate electrode 15A can be adjusted, thereby terminating dangling bonds of silicon in the channel region of a p-type MISFET. This can restrain the time variation in the threshold voltage and degradation in the saturation drain current.

Embodiment 3

A fabrication method for a semiconductor device according to a third embodiment of the present invention will be described hereinafter with reference to the drawings.

FIGS. 3A through 3E are cross-sectional views showing process steps in the fabrication method for a semiconductor device according to the third embodiment of the present invention. The left side of each of FIGS. 3A through 3E shows an n-type MISFET (nMIS transistor) formation region Rn, and the right side of each of FIGS. 3A through 3E shows a p-type MISFET (pMIS transistor) formation region Rp.

Figure 3A:
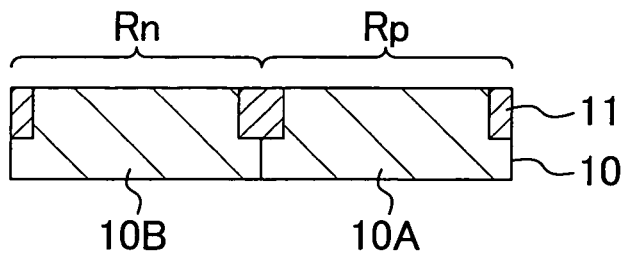
FIGS. 3A through 3E are cross-sectional views showing process steps in a fabricating method for a semiconductor device according to a third embodiment of the present invention.

First, in the process step shown in FIG. 3A of the fabrication method for a semiconductor device of this embodiment, an isolation area 11 is formed in a semiconductor substrate 10 of silicon by STI to surround active areas of the semiconductor substrate 10. Then, an n well 10A and a p well 10B are formed in parts of the silicon substrate 10 located in the p-type MISFET formation region Rp and the n-type MISFET formation region Rn, respectively. Thereafter, ions are implanted into the p-type MISFET formation region Rp and the n-type MISFET formation region Rn to adjust the threshold voltage, thereby forming diffusion layers for the adjustment of the threshold voltage (not shown) in both the regions, respectively.

Figure 3B:
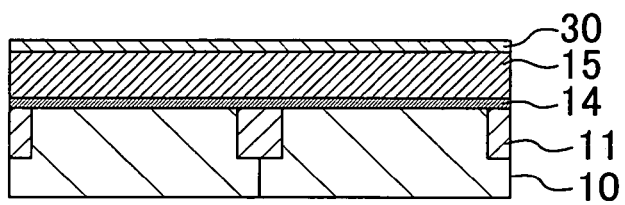

Next, in the process step shown in FIG. 3B, a 2-nm-thick silicon oxide film 14 is formed on the semiconductor substrate 10. Then, a 180-nm-thick polycrystalline silicon film 15 is formed on the silicon oxide film 14. Subsequently, an 80-nm-thick silicon oxide film 30 is formed on the polycrystalline silicon film 15.

Figure 3C:
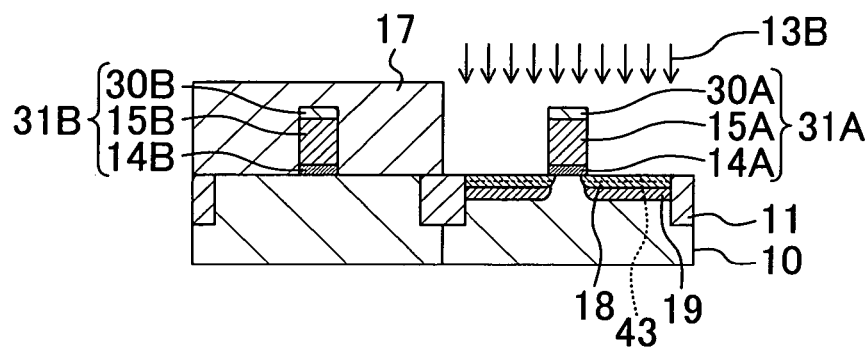

Next, in the process step shown in FIG. 3C, protective insulating films 30A and 30B are formed by selectively etching the silicon oxide film 30 using a mask for the formation of gate electrodes (not shown). Thereafter, the mask for the formation of gate electrodes is removed, and then the polycrystalline silicon film 15 and the silicon oxide film 14 are selectively etched using the protective insulating films 30A and 30B as hard masks, thereby forming gate insulating films 14A and 14B and gate electrodes 15A and 15B. In this way, a gate electrode precursor 31A composed of the gate insulating film 14A, the gate electrode 15A and the protective insulating film 30A for a p-type MISFET is partly formed on the active area of a part of the semiconductor substrate 10 located in the p-type MISFET formation region Rp. A gate electrode precursor 31B composed of the gate insulating film 14B, the gate electrode 15B and the protective insulating film 30B for an n-type MISFET is partly formed on the active area of a part of the semiconductor substrate 10 located in the n-type MISFET formation region Rn. The selective etching of the polycrystalline silicon film 15 and the silicon oxide film 14 reduces the thickness of the protective insulating films 30A and 30B to about 20 nm. The remaining parts of the protective insulating films 30A and 30B preferably has a thickness of 20±10 nm.

Thereafter, a resist 17 is formed on the semiconductor substrate 10 to cover the n-type MISFET formation region Rn and expose the p-type MISFET formation region Rp. Then, boron ions serving as a p-type impurity are implanted, using the resist 17 and the gate electrode precursor 31A as masks, into the active area of a part of the semiconductor substrate 10 located in the p-type MISFET formation region Rp at an implantation energy of 0.5 keV and an implant dose of $4 \times 10^{14}$ ions/cm$^2$, thereby forming p-type source/drain extension regions 18. Next, arsenic ions serving as an n-type impurity are implanted, using the resist 17 and the gate electrode precursor 31A as masks again, into the active area of a part of the semiconductor substrate 10 located in the p-type MISFET formation region Rp at an implantation energy of 70 keV and an implant dose of $3.2 \times 10^{13}$ ions/cm$^2$, thereby forming n-type pocket regions 19. This arsenic ion implantation is performed by rotational ion implantation at an implantation angle of 25°. Furthermore, fluorine ions 13B are implanted, using the resist 17 and the gate electrode precursor 31A as masks again, into the active area of a part of the semiconductor substrate 10 located in the p-type MISFET formation region Rp at an implantation energy of 15 keV and an implant dose of $1 \times 10^{15}$ ions/cm$^2$. In this way, fluorine-doped layers 43 are formed in parts of the semiconductor substrate 10 in which a source and a drain are to be formed. Since in this case the protective insulating film 30A is formed on the gate electrode 15A to have a smaller thickness than the depth to which fluorine ions are implanted into part of the semiconductor substrate 10, the gate electrode 15A is doped with a smaller amount of fluorine than that to be implanted into the semiconductor substrate 10. When the fluorine ions 13B are implanted into the active area of a part of the semiconductor substrate 10 located in the p-type MISFET formation region Rp under the above conditions, the fluorine ions 13B reaches the vicinity of the top surface of the semiconductor substrate 10.

Figure 3D:
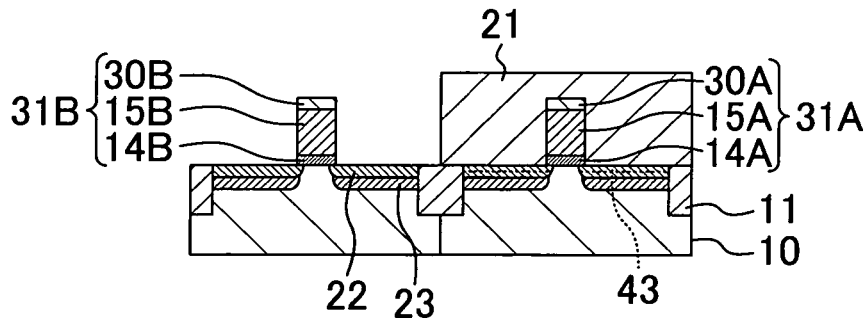

Next, in the process step shown in FIG. 3D, the resist 17 is removed, and then a resist 21 is formed on the semiconductor substrate 10 to cover the p-type MISFET formation region Rp and expose the n-type MISFET formation region Rn. Thereafter, arsenic ions serving as an n-type impurity are implanted, using the resist 21 and the gate electrode precursor 31B as masks, into the active area of a part of the semiconductor substrate 10 located in the n-type MISFET formation region Rn at an implantation energy of 4 keV and an implant dose of $6 \times 10^{14}$ ions/cm$^2$, thereby forming n-type source/drain extension regions 22. Next, boron ions serving as a p-type impurity are implanted, using the resist 21 and the gate electrode precursor 31B as masks again, into the active area of a part of the semiconductor substrate 10 located in the n-type MISFET formation region Rn at an implantation energy of 12 keV and an implant dose of $3.6 \times 10^{13}$ ions/cm$^2$, thereby forming p-type pocket regions 23. This boron ion implantation is performed by rotational ion implantation at an implantation angle of 25°.

Figure 3E:
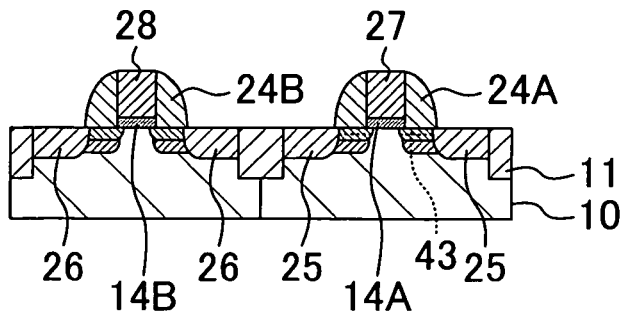

Next, in the process step shown in FIG. 3E, the resist 21 is removed, and then an insulating film (not shown) is formed to cover the semiconductor substrate 10 and the gate electrode precursors 31A and 31B and then subjected to anisotropic etching. In this way, sidewalls 24A and 24B are formed on the side surfaces of the gate electrodes 15A and 15B, respectively. Simultaneously, the protective insulating films 30A and 30B formed on the gate electrodes 15A and 15B are etched by overetching in the formation of the sidewalls 24A and 24B, thereby exposing the top surfaces of the gate electrodes 15A and 15B.

Subsequently, a mask (not shown) is formed on the semiconductor substrate 10 to cover the n-type MISFET formation region Rn and expose the p-type MISFET formation region Rp. Then, boron ions serving as a p-type impurity are implanted, using the mask, into the active area of a part of the semiconductor substrate 10 located in the p-type MISFET formation region Rp at an implantation energy of 3 keV and an implant dose of $3.6 \times 10^{15}$ ions/cm$^2$, thereby selectively forming heavily-doped p-type source/drain regions 25. Simultaneously with the formation of the p-type source/drain regions 25, boron ions are implanted into the gate electrode 15A to form a p$^+$ gate electrode 27.

On the other hand, a mask (not shown) is formed on the semiconductor substrate 10 to cover the p-type MISFET formation region Rp and expose the n-type MISFET formation region Rn. Then, arsenic ions serving as an n-type impurity are implanted, using the mask, into the active area of a part of the semiconductor substrate 10 located in the n-type MISFET formation region Rn at an implantation energy of 50 keV and an implant dose of $4.0 \times 10^{15}$ ions/cm$^2$, thereby forming heavily-doped n-type source/drain regions 26. Simultaneously with the formation of the n-type source/drain regions 26, arsenic ions are implanted into the gate electrode 15B to form an n$^+$ gate electrode 28.

Thereafter, the semiconductor substrate 10 is subjected to spike RTA under a nitrogen atmosphere at a temperature of 1075° C., thereby activating impurities implanted into the source/drain regions 25 and 26 and the gate electrodes 27 and 28. This spike RTA allows fluorine in the gate electrode 15A to diffuse toward the interface between the gate insulating film 14A and the semiconductor substrate 10.

Since in this embodiment fluorine ions 13B are implanted into a semiconductor substrate 10 with the top surface of a gate electrode 15A covered with a protective insulating film 30A in the process step shown in FIG. 3C, the amount of fluorine to be implanted into the gate electrode 15A can be adjusted. This can prevent an excessive amount of fluorine from being implanted into the gate electrode 15A, resulting in the prevented boron penetration. Furthermore, since many traps can be restrained from being formed in a gate insulating film 14A, this can prevent the reliability of the gate insulating film 14A from being reduced.

Meanwhile, in the process step shown in FIG. 3C, a sufficient amount of fluorine can be implanted into the semiconductor substrate 10, thereby terminating dangling bonds of silicon in the channel region of a p-type MISFET. This can restrain the time variation in the threshold voltage and degradation in the saturation drain current.

Figure 4:
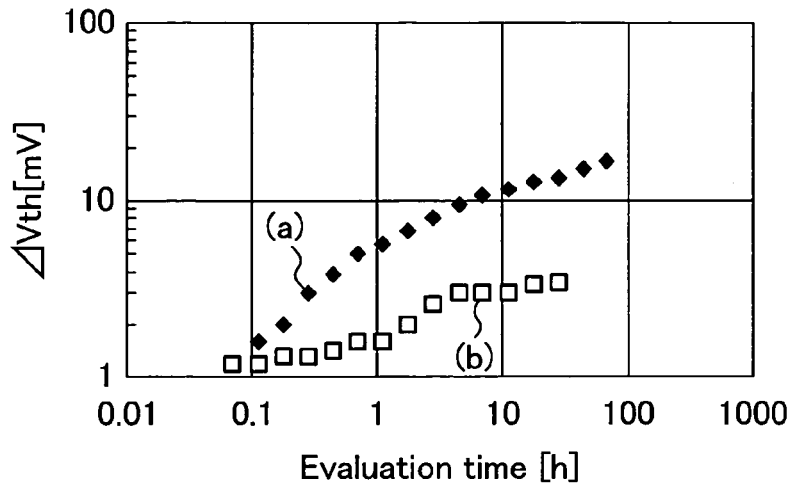
FIG. 4 is a graph showing time variations in the respective threshold voltages of a known p-type MISFET and a p-type MISFET of a third embodiment of the present invention.

FIG. 4 is a graph showing time variations in the respective threshold voltages of a known p-type MISFET and a p-type MISFET of the third embodiment. In FIG. 4, the axis of abscissas represents an elapsed time, and the axis of ordinates represents the threshold-voltage variation of each p-type MISFET. The profile (a) shows a result obtained by measuring a known p-type MISFET whose channel region is not doped with fluorine ions, and the profile (b) shows a result obtained by measuring a p-type MISFET formed according to the method of this embodiment. These results were evaluated by measuring the threshold-voltage variations of the p-type MISFETs with the gate voltage applied to the gate electrode at a temperature of 150° C., i.e., with a stress applied to the gate electrode.

As seen from FIG. 4, the threshold-voltage variation can more significantly be restrained in a p-type MISFET sample whose channel region is doped with the right amount of fluorine according to the method of the third embodiment, as compared with a known p-type MISFET sample.

Figure 5:
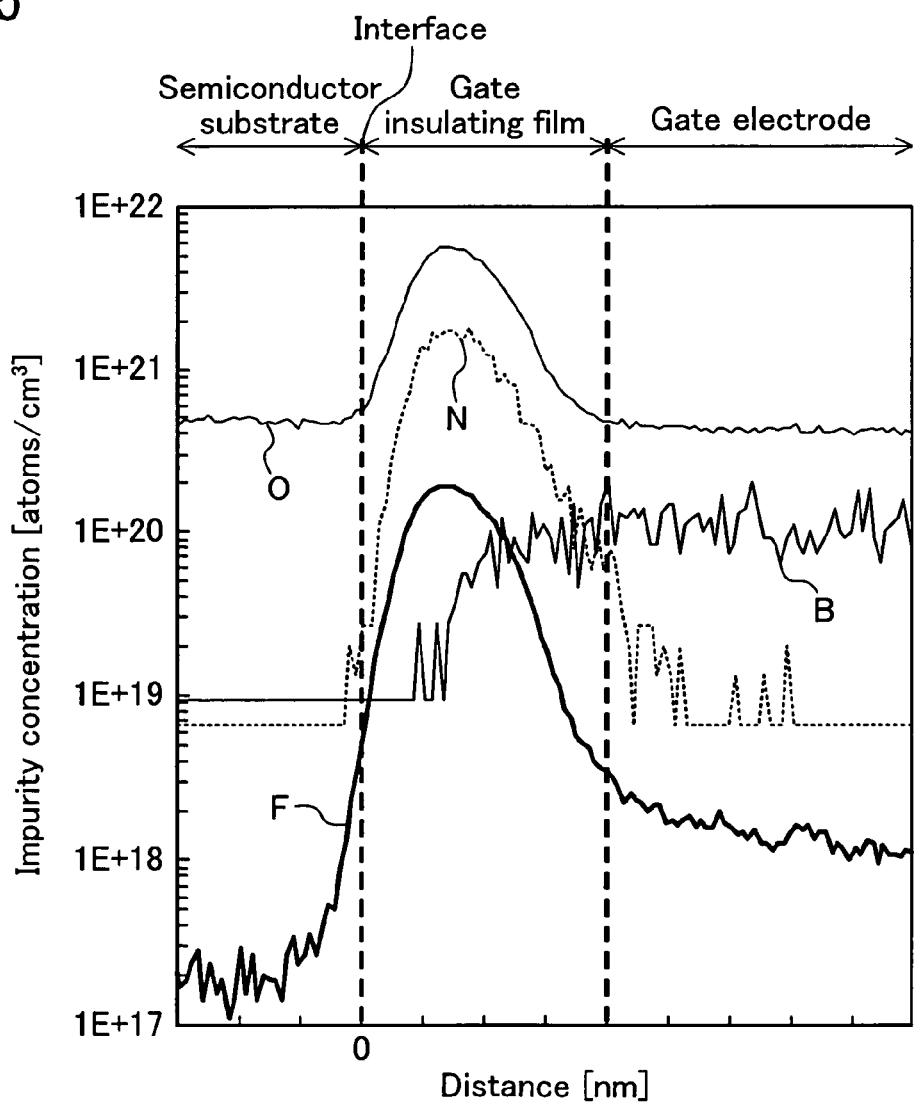
FIG. 5 is a graph showing the impurity concentration in a gate electrode of the p-type MISFET of the third embodiment.

FIG. 5 is a graph showing the impurity concentration in the gate electrode of the p-type MISFET of the third embodiment. Shown in FIG. 5 is a result obtained by measuring the impurity concentrations in the p-type MISFET sample fabricated according to the method of the third embodiment by backside secondary ion mass spectroscopy (SIMS). Fluorine ions are implanted into this p-type MISFET sample at an implantation energy of 15 keV and an implant dose of $1.0 \times 10^{15}$ ions/cm$^2$. In FIG. 5, the axis of abscissas represents a distance from the interface between the semiconductor substrate and the gate insulating film, and the axis of ordinates represents the impurity concentration. The left-hand side of the axis of abscissas relative to the interface is for the semiconductor substrate, and the right-hand side of the axis of abscissas relative to the interface is for the gate insulating film.

As seen from FIG. 5, the fluorine concentration in the interface between the semiconductor substrate and the gate insulating film is approximately $1 \times 10^{18}$ through $5 \times 10^{18}$ ions/cm$^3$.

Figure 6:
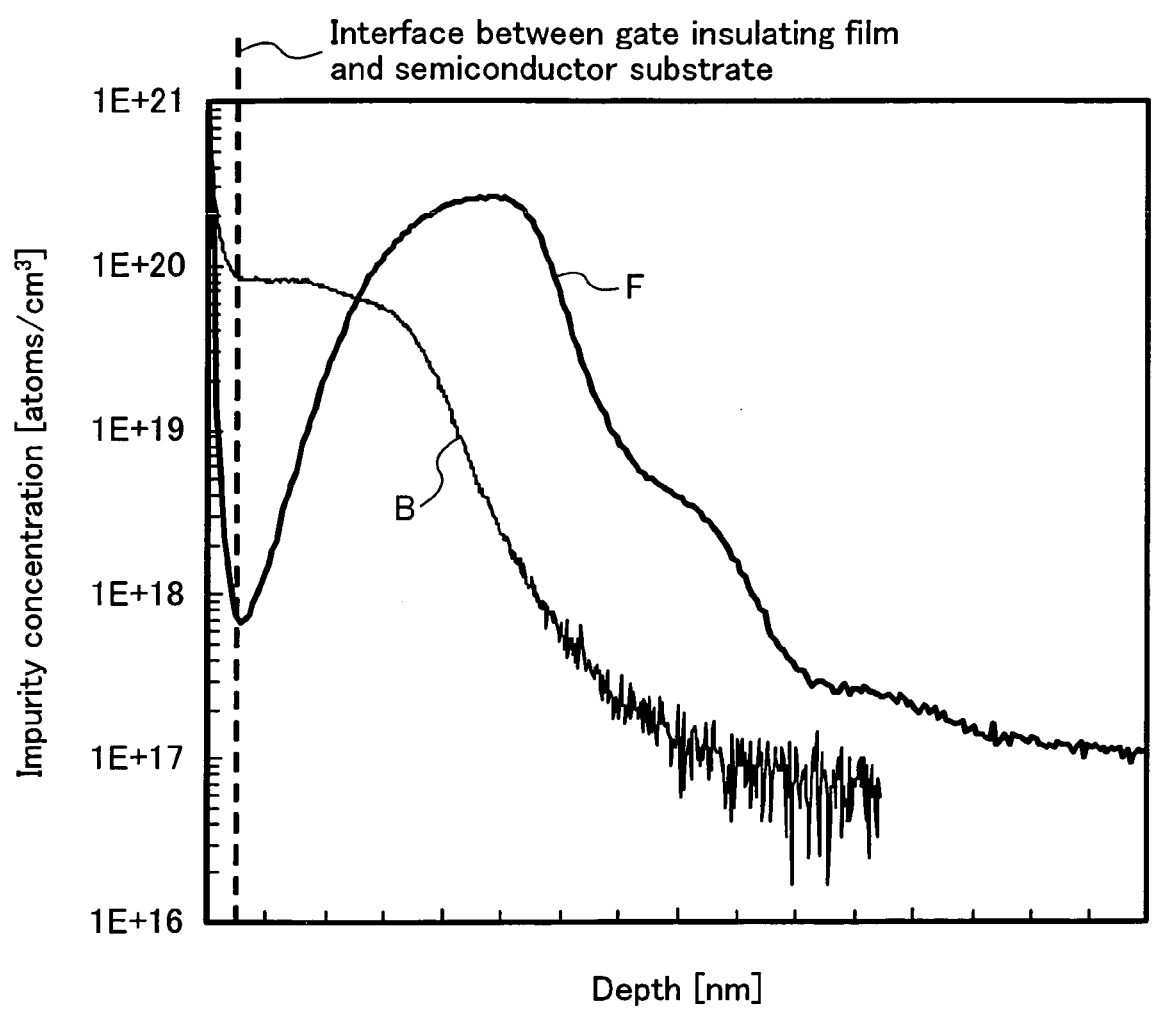
FIG. 6 is a graph showing the impurity concentration in each of source/drain extension regions of the p-type MISFET of the third embodiment.
Figure 7A:
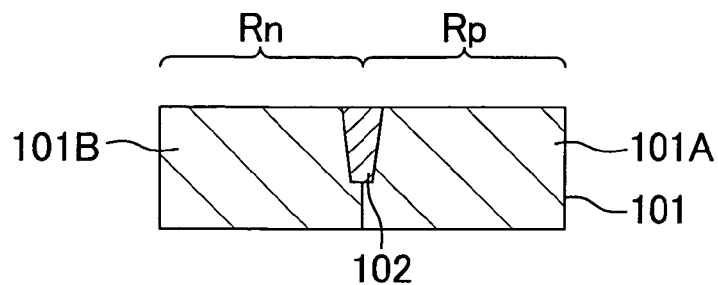
FIGS. 7A through 7E are cross-sectional views showing process steps in a known fabricating method for a semiconductor device.
Figure 7B:
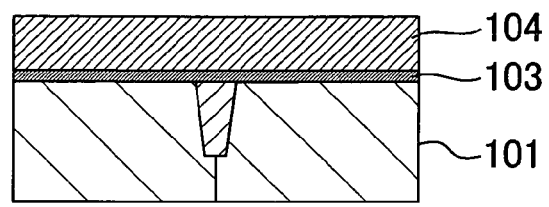
Figure 7C:
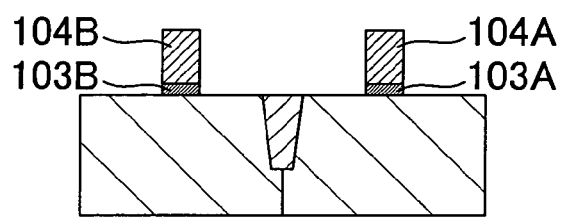
Figure 7D:
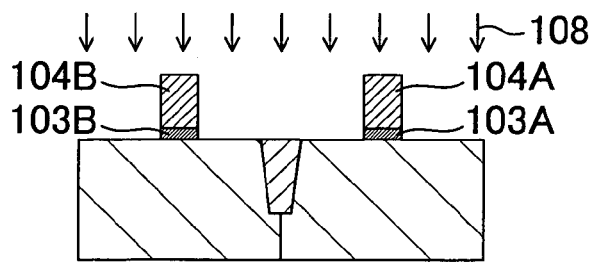
Figure 7E:
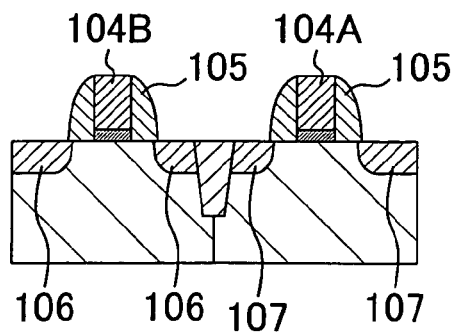

FIG. 6 is a graph showing the impurity concentration in a source or drain extension region of the p-type MISFET according to the third embodiment. Shown in FIG. 6 is a result obtained by measuring the impurity concentration in a p-type MISFET sample fabricated according to the method of the third embodiment by SIMS. Fluorine ions are implanted into the p-type MISFET sample at an implantation energy of 15 keV and an implant dose of $1.0 \times 10^{15}$ ions/cm$^2$. In FIG. 6, the axis of abscissas represents the depth of a semiconductor substrate, and the axis of ordinates represents the impurity concentration.

As shown in FIG. 6, the fluorine concentration in the interface between a gate insulating film and each of parts of the semiconductor substrate located under a sidewall is $4 \times 10^{17}$ through $1 \times 10^{18}$ ions/cm$^3$. Detailed studies showed that when the fluorine concentration in a part of the channel region located under the gate insulating film is $5 \times 10^{17}$ through $1 \times 10^{19}$ ions/cm$^3$ and the fluorine concentration in each of lateral end parts of the channel region located under the sidewall is $2 \times 10^{17}$ through $2 \times 10^{18}$ ions/cm$^3$, this is effective at reducing the time variation in the threshold voltage and the saturation drain current of the p-type MISFET.

While the above embodiments of the present invention have been described above, it will be understood that a specific structure of the present invention is not limited to the above embodiments. On the contrary, the invention is intended to cover all modifications, such as design modifications, as may be included within the scope of the invention.

For example, instead of the gate oxide film, a gate oxynitride film or a gate oxide film whose top surface is plasma-nitrided can be used as the gate insulating film. Although in the above embodiments a description was given of the case where a 2-nm-thick silicon oxide film is used as the gate insulating film, a thicker gate insulating film made of a silicon oxide film, an oxynitride film or any other film may be used in the present invention.

Although in the descriptions of the above embodiments a formation process for a semiconductor device having a CMIS structure was used as an example, it is needless to say that the present invention can be applied to the formation of a pMIS transistor in a DRAM or any other device.

What is claimed is:

1. A method for fabricating a semiconductor device at least comprising a p-type MISFET formed on a first active area of a semiconductor substrate, said method comprising the steps of:
    (a) forming a gate insulating film, a gate electrode film and a protective insulating film on the semiconductor substrate;
    (b) forming on the first active area a first gate insulating film, a first gate electrode and a first protective insulating film by patterning the gate insulating film, the gate electrode film and the protective insulating film;
    (c) forming p-type source/drain extension regions in parts of the first active area located below the lateral end parts of the first gate electrode;
    (d) implanting fluorine ions into the parts of the first active area located below the lateral end parts of the first gate electrode with the top surface of the first gate electrode covered with the first protective insulating film;
    (e) after the steps (c) and (d), forming a first sidewall on the side surfaces of the first gate electrode; and
    (f) forming p-type source/drain regions in parts of the first active area located below the outer lateral end parts of the first sidewall; and
    (g) after the step (f), subjecting the semiconductor substrate to a heat treatment,
    wherein in the step (d), the first gate electrode covered with the first protective insulating film having a thickness smaller than a depth to which fluorine is implanted is doped with fluorine in an amount smaller than that to be implanted into the first active area and an amount larger than 0, and
    in the step (g), the heat treatment allows fluorine in the first gate electrode to diffuse toward an interface between the first gate insulating film and the semiconductor substrate.

2. The method of claim 1, wherein
    the total dose of fluorine to be implanted into parts of the first active area located under the first sidewall is larger than that to be implanted into the first gate electrode.

3. The method of claim 1, wherein an n-type MISFET is formed on a second active area of the semiconductor substrate, and in the step (d), the fluorine ions are not implanted into the second active area.

4. The method of claim 3, wherein
    the step (b) includes a step of forming on the second active area a second gate insulating film, a second gate electrode and a second protective insulating film by patterning the gate insulating film, the gate electrode film and the protective insulating film,
    the step (c) includes a step of forming n-type source/drain extension regions in parts of the second active area located below the lateral end parts of the second gate electrode,
    the step (e) includes a step of forming a second sidewall on the side surfaces of the second gate electrode, and
    the step (f) includes a step of forming n-type source/drain regions in parts of the second active area located below the outer lateral end parts of the second sidewall.

5. The method of claim 1, wherein the gate electrode film is made of a polycrystalline silicon film.

6. The method of claim 1, wherein the first protective insulating film in the step (d) has a thickness of from 10 nm to 30 nm.

7. The method of claim 1, wherein in the step (c), boron ions are implanted and whereby the p-type source/drain extension regions are formed.

8. The method of claim 1, wherein the step (e) includes the sub-step of etching the first protective insulating film, thereby exposing the top surfaces of the first gate electrode.

9. The method of claim 1, wherein after the heat treatment in the step (g), a fluorine concentration in the interface between the first gate insulating film and the semiconductor substrate is $1 \times 10^{18}$ through $5 \times 10^{18}$ ions/cm$^3$.

10. The method of claim 1, wherein after the heat treatment in the step (g), a fluorine concentration in an interface between the first gate insulating film and a part of the semiconductor substrate located under the first sidewall is $4 \times 10^{17}$ through $1 \times 10^{18}$ ions/cm$^3$.

11. The method of claim 1, wherein after the heat treatment in the step (g), a fluorine concentration in a part of a channel region located under the first gate insulating film is $5 \times 10^{17}$ through $1 \times 10^{19}$ ions/cm$^3$.

12. The method of claim 1, wherein after the heat treatment in the step (g), a fluorine concentration in an end part of a channel region located under the first sidewall is $2 \times 10^{17}$ through $2 \times 10^{18}$ ions/cm$^3$.

* * * * *

UNITED STATES PATENT AND TRADEMARK OFFICE
CERTIFICATE OF CORRECTION

| | | |
|---|---|---|
| PATENT NO. | : 7,666,736 B2 | Page 1 of 1 |
| APPLICATION NO. | : 11/265102 | |
| DATED | : February 23, 2010 | |
| INVENTOR(S) | : Yoshihiro Satou | |

It is certified that error appears in the above-identified patent and that said Letters Patent is hereby corrected as shown below:

Title Page,
In Item "(56) References Cited" under "Foreign Patent Documents," please change "JP 11-163346 A" to --JP 11-163345 A--.

Signed and Sealed this

Fifteenth Day of June, 2010

David J. Kappos
*Director of the United States Patent and Trademark Office*